US012776621B2

(12) United States Patent
Gong et al.

(10) Patent No.: US 12,776,621 B2
(45) Date of Patent: Oct. 27, 2026

(54) GREEN LASER PHASE RANGEFINDER AND RANGING METHOD

(71) Applicant: SHANGHAI LAMSHINE CO., LTD, Shanghai (CN)

(72) Inventors: Zhi Gong, Shanghai (CN); Kai Dong, Shanghai (CN); Bangqi Chen, Shanghai (CN)

(73) Assignee: SHANGHAI LAMSHINE CO., LTD, Shanghai (CN)

( * ) Notice: Subject to any disclaimer, the term of this patent is extended or adjusted under 35 U.S.C. 154(b) by 309 days.

(21) Appl. No.: 18/788,377

(22) Filed: Jul. 30, 2024

(65) Prior Publication Data

US 2024/0421560 A1 Dec. 19, 2024

Related U.S. Application Data

(63) Continuation of application No. PCT/CN2024/098030, filed on Jun. 7, 2024.

(30) Foreign Application Priority Data

Jun. 14, 2023 (CN) ......................... 202310707858.0

(51) Int. Cl.
*G01C 3/08* (2006.01)
*G01S 7/481* (2006.01)
(Continued)

(52) U.S. Cl.
CPC ............ *H01S 5/062* (2013.01); *G01S 7/4813* (2013.01); *H01S 5/4087* (2013.01)

(58) Field of Classification Search
CPC ....... H01S 5/062; H01S 5/4087; G01S 7/4813
See application file for complete search history.

(56) References Cited

U.S. PATENT DOCUMENTS

2025/0377456 A1* 12/2025 Jørgensen ........... G01S 15/8925

FOREIGN PATENT DOCUMENTS

CN 106646502 A * 5/2017 ............. G01S 17/36
CN 108931782 A * 12/2018 ............. G01S 17/08

(Continued)

OTHER PUBLICATIONS

International Search Report issued in corresponding International application No. PCT/CN2024/098030, mailed Sep. 4, 2024.

(Continued)

*Primary Examiner* — Mark Hellner
(74) *Attorney, Agent, or Firm* — HOWARD M COHN and Associates, LLC

(57) ABSTRACT

Disclosed are a green laser phase rangefinder and a ranging method, which relate to the field of laser ranging. The rangefinder includes a direct digital synthesizer (DDS), a frequency mixing filter circuit, a microcontroller unit (MCU), a first amplifier circuit, an analog switch, a first laser beam module, a second laser beam module, a second amplifier circuit, an avalanche photodiode, a third amplifier circuit and band pass filter circuit, an analog-to-digital converter (ADC) module, a receiving lens, and a high-voltage circuit. A green laser diode is arranged in the first laser beam module; and a red laser diode is arranged in the second laser beam module. In the present disclosure, the green laser diode and the red laser diode are combined to implement ranging. The present disclosure features low power consumption, low costs, and high measurement accuracy.

7 Claims, 2 Drawing Sheets

(51) Int. Cl.

| | |
|---|---|
| ***H01S 5/062*** | (2006.01) |
| ***H01S 5/40*** | (2006.01) |

(56) References Cited

FOREIGN PATENT DOCUMENTS

| | | | | | |
|---|---|---|---|---|---|
| CN | 109917405 | A | | 6/2019 | |
| CN | 112034436 | A | * | 12/2020 | ........... G01S 7/4814 |
| CN | 114137559 | A | | 3/2022 | |
| CN | 216718698 | U | * | 6/2022 | ............. G01S 17/32 |
| CN | 16699622 | A | | 9/2023 | |
| CN | 116893401 | A | | 10/2023 | |
| JP | 2001183458 | A | | 7/2001 | |

OTHER PUBLICATIONS

Written Opinion of the International Search Authority in corresponding International application No. PCT/CN2024/098030, mailed Sep. 4, 2024.

* cited by examiner

GREEN LASER PHASE RANGEFINDER AND RANGING METHOD

TECHNICAL FIELD

The present disclosure relates to the field of laser ranging, and in particular, to a green laser phase rangefinder and a ranging method.

BACKGROUND

With the progress of materials, a green semiconductor laser diode technology is becoming increasingly mature, and some manufacturers worldwide have taken the lead in mass production of semiconductor laser diodes in a 510-530 nm band, with a green band range. A conventional hand-held laser rangefinder uses a laser diode in a 630-660 nm band, with a red band range. Because of a special structure of human eyes, human eyes are more sensitive to green light, and thus humans have higher visibility of green light.

Because human eyes are more sensitive to green laser light, a green laser in the hand-held laser rangefinder industry is more widely used. There are the following comparative experiments. Laser light power is 1 mW and outdoor white wall illumination is 5000 lux (lux is a unit indicating an illumination intensity, and a larger number indicates stronger illumination): a person holds a laser rangefinder and irradiates a laser spot on a surface of a white wall. The person retreats in a direction perpendicular to the wall, and observes the laser spot with naked eyes at the same time to determine whether the laser spot is visible. When the laser band is 650 nm, a visible distance is about 10 m; and when the laser band is 520 nm, the visible distance is 30 meters. Thus, it can be seen that under the same conditions, the visible distance of green laser light is about 3 times that of red light. During ranging, the hand-held laser rangefinder needs to use a laser spot to find a point first and then performs measurement. This makes the application of green laser light in the field of hand-held laser rangefinders have very great advantages.

The working principle of one solution of an existing hand-held green laser rangefinder is as follows. A microcontroller unit (MCU) controls a direct digital synthesizer (DDS) to generate a signal with a frequency f1 and a signal with a frequency f2. The signal with f1 is amplified by an amplifier circuit and then modulated on a green laser diode 1. The signal with f2 is amplified by an amplifier circuit 2 and then modulated on an avalanche photodiode (APD). The signal with f1 and the signal with f2 are simultaneously input to a frequency mixing filter circuit, and an output signal of the frequency mixing filter circuit is input to the MCU to synchronize a measurement signal. During ranging, the MCU controls a power supply of the green laser diode 1 to be turned on, and the signal with f1 is amplified and then modulated on the green laser diode 1, so that a laser beam 1 emitted by the green laser diode changes in brightness, with a change frequency the same as the frequency f1. After irradiating a tested object, the laser beam 1 is reflected by a surface of the object, and reflected light is received by the APD through a receiving lens. The APD converts an optical signal into an electrical signal with a frequency being f1. In addition, an electrical signal with the frequency f2 that is coupled to the APD and the electrical signal with the frequency f1 are mixed in the APD to generate two electrical signals with new frequencies: f1+f2 and f1−f2 (where f1>f2). The APD outputs the two signals to an amplifier circuit 3 and band pass filter circuit (a center frequency of a band pass filter circuit is f1−f2), leaving only the electrical signal with the frequency of f1−f2. This signal is a measurement signal. After synchronization with f3, a phase of the signal represents a measured distance D1. In this solution, a single green laser is adopted to implement ranging. When an external environmental temperature changes, a temperature change may cause a phase shift of electronic components and laser diodes, thus causing accuracy to change with the temperature. Measurement accuracy of a laser rangefinder made of one green laser diode is not high.

The working principle of the other solution is as follows. An MCU controls a DDS to generate a signal with a frequency f1, a signal with a frequency f2, and a signal with a frequency f3. The signal with f1 is amplified by an amplifier circuit and then modulated on a green laser diode 1 and a green laser diodes 2. The signal with f2 is amplified by an amplifier circuit 2 and then modulated on an avalanche photodiode (APD). The signal with f3 is input to the MCU to synchronize a measurement signal. During ranging, the MCU first controls a power supply of the green laser diode 1 to be turned on and a power supply of the green laser diode 2 to be turned off. As a result, a laser beam 1 emitted by the green laser diode 1 changes in brightness, with a change frequency the same as the frequency f1. After irradiating a tested object, the laser beam 1 is reflected by a surface of the object, and reflected light is received by the APD through a receiving lens. The APD converts an optical signal into an electrical signal with a frequency being f1. In addition, an electrical signal with the frequency f2 that is coupled to the APD and the electrical signal with the frequency f1 are mixed in the APD to generate two electrical signals with new frequencies: f1+f2 and f1-f2 (where f1>f2). The APD outputs the two signals to an amplifier circuit 3 and band pass filter circuit (a center frequency of a band pass filter circuit is f1-f2), leaving only the electrical signal with the frequency of f1-f2. This signal is a measurement signal. After synchronization with f3, a phase of the signal represents a measured distance D1. Similarly, the MCU controls the power supply of the green laser diode 1 to be turned off and the power supply of the green laser diode 2 to be turned on. A laser beam 2 irradiates an internal cavity of the rangefinder, and is reflected and then received by the APD, so that a distance D2 by which the laser beam 2 is transmitted in the internal cavity can be measured (D2 is a fixed value). A final distance D=D1−D2. A difference between internal and external distances can reduce an impact of the environmental temperature on the rangefinder. In this solution, two green lasers are adopted to implement ranging. Since power consumption of the green laser diode is about 4 times that of a red laser diode, the green laser diode is likely to generate heat when operating. In addition, the price of the green laser diode is about 15 times that of the red laser diode. Using two green laser diodes to manufacture a laser rangefinder has the following disadvantages: high costs and high power consumption.

To sum up, the existing hand-held green laser rangefinder has the disadvantages of high power consumption, high costs, and low measurement accuracy.

SUMMARY

An objective of the present disclosure is to provide a green laser phase rangefinder and a ranging method, which feature low power consumption, low costs, and high measurement accuracy.

To achieve the above objective, the present disclosure provides the following solutions.

A green laser phase rangefinder includes a direct digital synthesizer (DDS), a frequency mixing filter circuit, a microcontroller unit (MCU), a first amplifier circuit, an analog switch, a first laser beam module, a second laser beam module, a second amplifier circuit, an avalanche photodiode, a third amplifier circuit and band pass filter circuit, an analog-to-digital converter (ADC) module, a receiving lens, and a high-voltage circuit, where a green laser diode is arranged in the first laser beam module; and a red laser diode is arranged in the second laser beam module;

the DDS generates a signal with a frequency f1, a signal with a frequency f2, and a signal with a frequency f3; the signal with the frequency f1 passes through the first amplifier circuit and then enters the analog switch; the analog switch inputs an amplified signal with the frequency f1 into the first laser beam module and the second laser beam module; the signal with the frequency f2 passes through the second amplifier circuit and then is modulated on the avalanche photodiode; the signal with the frequency f1 and the signal with the frequency f2 are input into the MCU through the frequency mixing filter circuit; the signal with the frequency f3 is input to MCU to synchronize a measurement signal; and during ranging, the MCU controls a power supply of the green laser diode in the first laser beam module to be turned on, and a power supply of the red laser diode in the first laser beam module to be turned off; at the same time, the MCU controls the analog switch to modulate the amplified signal with the frequency f1 on the green laser diode and disconnect the amplified signal with the frequency f1 from the red laser diode, so that a first laser beam emitted by the green laser diode changes in brightness, with a change frequency the same as the frequency f1; after irradiating a tested object, the first laser beam is reflected by a surface of the object, the reflected light passes through the receiving lens to be received by the avalanche photodiode, and the avalanche photodiode converts the optical signal into an electrical signal with a frequency being f1; the electrical signal with the frequency f2 that is coupled to the avalanche photodiode and the electrical signal with the frequency f1 are mixed on the avalanche photodiode to generate two electrical signals with new frequencies; the avalanche photodiode outputs the two electrical signals with new frequencies to the third amplifier circuit and band pass filter circuit to obtain a measurement signal; after the measurement signal is synchronized with the signal with the frequency f3 or an output signal of the frequency mixing filter circuit, a measured distance D1 is determined based on a phase of the synchronized measurement signal; the MCU controls the power supply of the green laser diode to be turned off and the power supply of the red laser diode to be turned on; at the same time, the MCU controls the analog switch to disconnect the amplified signal with the frequency f1 from the green laser diode and modulate the amplified signal with frequency f1 onto the red laser diode; a second laser beam irradiates an internal cavity of the rangefinder and is reflected and then received by the avalanche photodiode, thereby measuring a distance D2 by which the second laser beam is transmitted in the internal cavity of the rangefinder; and a measured distance D is determined based on a difference between the measured distance D1 and the distance D2.

Optionally, the first laser beam module includes a first power supply circuit, a first switch, and a green laser diode.

Optionally, the second laser beam module includes a second power supply circuit, a second switch, and a red laser diode.

Optionally, frequencies of the two electrical signals with new frequencies are f1+f2 and f1−f2, where f1>f2.

Optionally, a center frequency of a band pass filter circuit in the third amplifier circuit and band pass filter circuit is f1-f2.

A measurement method for a green laser phase rangefinder is applied to the green laser phase rangefinder. The measurement method includes:

placing the green laser phase rangefinder at a position away from a target surface by a standard measured distance of L0;

using, based on the green laser phase rangefinder, a measuring ruler 1 for ranging to obtain a measured distance D1, a measured distance D2, and a measured distance D3, where the measured distance D1 corresponds to the measuring ruler 1; the measured distance D2 corresponds to the measuring ruler 2; the measured distance D3 corresponds to the measuring ruler 3; and a frequency of the measuring ruler 1 is greater than that of the measuring ruler 2 and that of the measuring ruler 3;

determining, with the measured distance D1 as a reference distance, a deviation $\nabla_{D2-D1}$ of the measuring ruler 2 relative to the measuring ruler 1 and a deviation $\nabla_{D3-D1}$ of the measuring ruler 3 relative to the measuring ruler 1;

correcting the measured distance D2 by means of $\nabla_{D2-D1}$ to obtain a measured distance D2';

correcting the measured distance D3 by means of the deviation $\nabla_{D3-D1}$ to obtain a measured distance D3';

connecting the measured distance D1, the measured distance D2', and the measured distance D3' to obtain a measured distance D;

obtaining a measured distance C0 based on a difference between the standard measured distance L0 and the measured distance D;

performing, based on the green laser phase rangefinder, ranging on a measured target by different measuring rulers to determine a connected measured distance D4; and determining a target measured distance based on a difference between the connected measured distance D4 and the measured distance C0.

According to specific embodiments of the present disclosure, the present disclosure has the following technical effects.

In the green laser phase rangefinder and the ranging method according to the present disclosure, during ranging, the MCU controls the power supply of the green laser diode in the first laser beam module to be turned on, and the power supply of the red laser diode in the first laser beam module to be turned off. At the same time, the MCU controls the analog switch to modulate the amplified signal with the frequency f1 on the green laser diode and disconnect the amplified signal with the frequency f1 from the red laser diode, so that a first laser beam emitted by the green laser diode changes in brightness, with a change frequency the same as the frequency f1. After irradiating a tested object, the first laser beam is reflected by a surface of the object, the reflected light passes through the receiving lens to be received by the avalanche photodiode, and the avalanche photodiode converts the optical signal into an electrical signal with a frequency being f1. The electrical signal with the frequency f2 that is coupled to the avalanche photodiode and the electrical signal with the frequency f1 are mixed on the avalanche photodiode to generate two electrical signals with new frequencies. The avalanche photodiode outputs the two electrical signals with new frequencies to the third amplifier circuit and band pass filter circuit to obtain a measurement signal. After the measurement signal is synchronized with the signal with the frequency f3 or an output signal of the frequency mixing filter circuit, a measured distance D1 is determined based on a phase of the synchronized measurement signal. The MCU controls the power supply of the green laser diode to be turned off and the power supply of the red laser diode to be turned on. At the same time, the MCU controls the analog switch to disconnect the amplified signal with the frequency f1 from the green laser diode and modulate the amplified signal with frequency f1 onto the red laser diode. A second laser beam irradiates the internal cavity of the rangefinder and is reflected and then received by the avalanche photodiode, thereby measuring a distance D2 by which the second laser beam is transmitted in the internal cavity of the rangefinder. A measured distance D is determined based on a difference between the measured distance D1 and the distance D2. That is, in the present disclosure, ranging is implemented by controlling the first laser beam module and the second laser beam module, and the green laser diode and the red laser diode are combined, which ensures measurement accuracy, and reduces power consumption and costs.

BRIEF DESCRIPTION OF THE DRAWINGS

To describe the technical solutions in embodiments of the present disclosure or in the prior art more clearly, the accompanying drawings required for the embodiments are briefly described below. Apparently, the accompanying drawings in the following description show merely some embodiments of the present disclosure, and those of ordinary skill in the art may still derive other accompanying drawings from these accompanying drawings without creative efforts.

DETAILED DESCRIPTION OF THE EMBODIMENTS

The technical solutions of the embodiments of the present disclosure are clearly and completely described below with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the protection scope of the present disclosure.

An objective of the present disclosure is to provide a green laser phase rangefinder and a ranging method, which feature low power consumption, low costs, and high measurement accuracy.

In order to make the above objective, features and advantages of the present disclosure clearer and more comprehensible, the present disclosure is further described in detail below with reference to the accompanying drawings and specific implementations.

Figure 1:
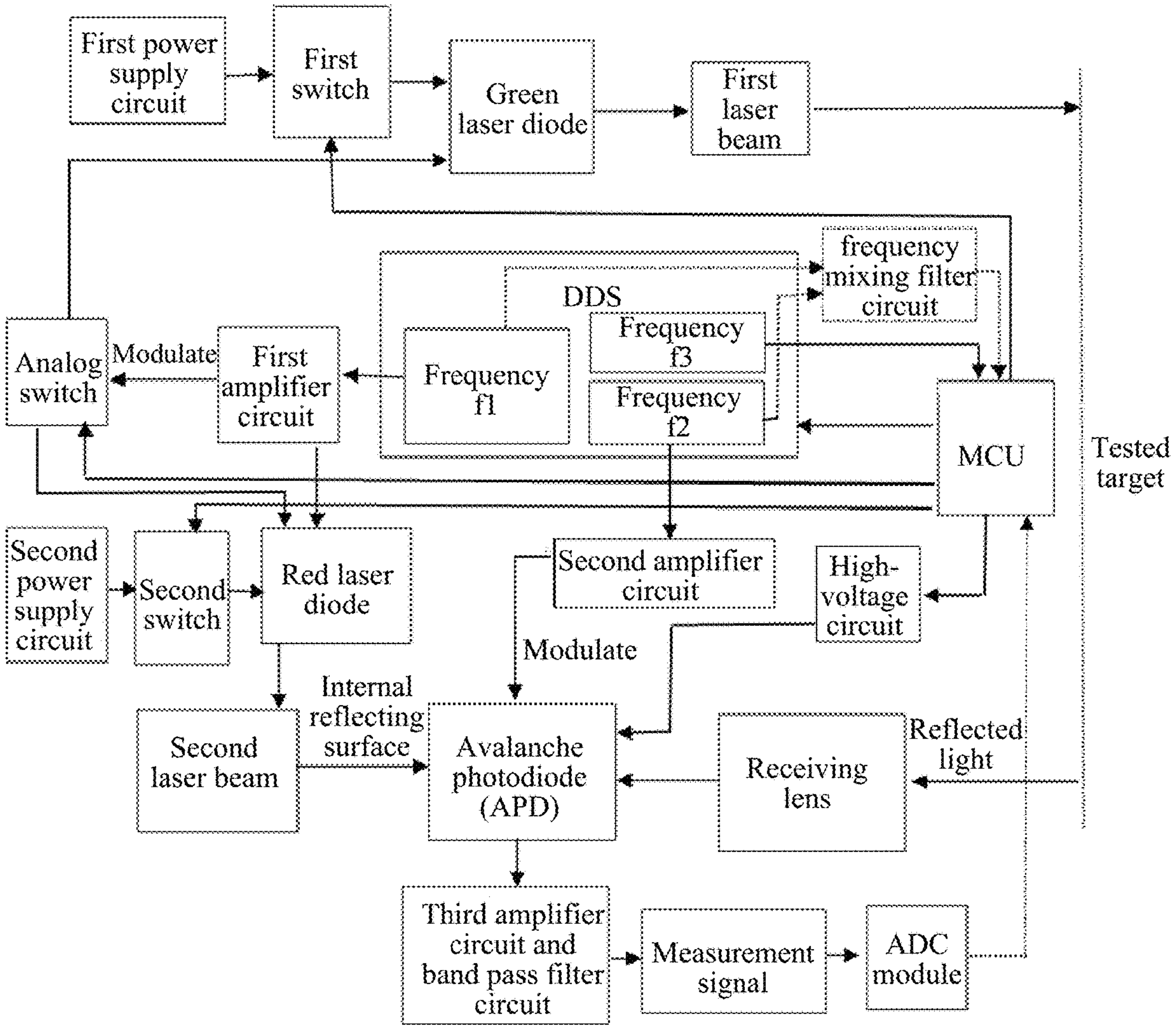
FIG. 1 is a schematic structural diagram of a green laser phase rangefinder according to the present disclosure.

As shown in FIG. 1, a green laser phase rangefinder according to the present disclosure includes a DDS, a frequency mixing filter circuit, an MCU, a first amplifier circuit, an analog switch, a first laser beam module, a second laser beam module, a second amplifier circuit, an avalanche photodiode (APD), a third amplifier circuit and band pass filter circuit, an analog-to-digital converter (ADC) module, a receiving lens, and a high-voltage circuit. A green laser diode is arranged in the first laser beam module; and a red laser diode is arranged in the second laser beam module.

Figure 2:
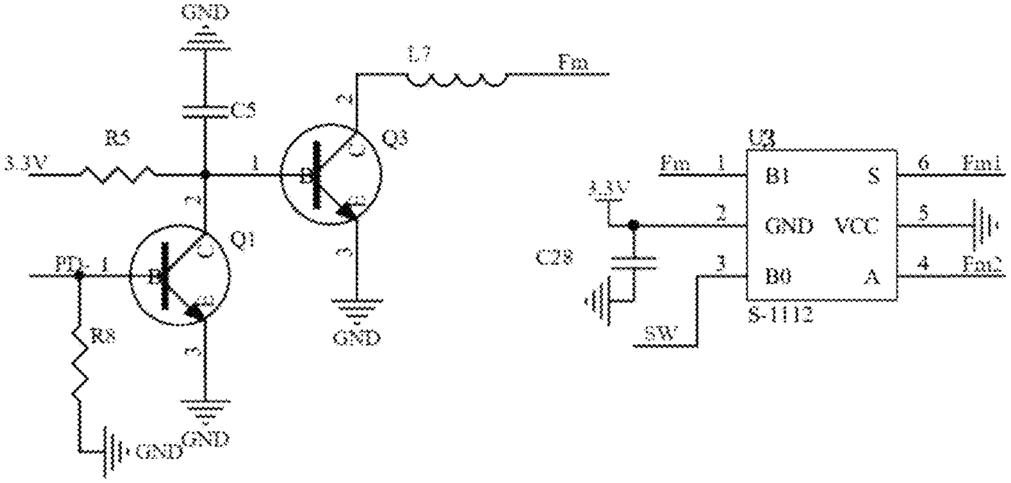
FIG. 2 is a schematic structural diagram of an analog switch.

The DDS generates a signal with a frequency f1, a signal with a frequency f2, and a signal with a frequency f3. The signal with the frequency f1 passes through the first amplifier circuit and then enters the analog switch. The analog switch inputs an amplified signal with the frequency f1 into the first laser beam module and the second laser beam module. As shown in FIG. 2, the signal enters an input channel (a pin 4) of the analog switch (U3), and two output channels (a pin 1 and a pin 3) of the analog switch are connected to the green laser diode (J1) (the band of the green laser diode is between 490 nm and 560 nm) and the red laser diode (J2) (the band of the red laser diode is between 580 nm and 905 nm), respectively. The signal with the frequency f2 passes through the second amplifier circuit and then is modulated on the avalanche photodiode. The signal with the frequency f1 and the signal with the frequency f2 are input into the MCU through the frequency mixing filter circuit. The signal with the frequency f3 is input to MCU to synchronize a measurement signal.

During ranging, the MCU controls a power supply of the green laser diode in the first laser beam module to be turned on, and a power supply of the red laser diode in the first laser beam module to be turned off. At the same time, the MCU controls the analog switch to modulate the amplified signal with the frequency f1 on the green laser diode and disconnect the amplified signal with the frequency f1 from the red laser diode, so that a first laser beam emitted by the green laser diode changes in brightness, with a change frequency the same as the frequency f1. After irradiating a tested object, the first laser beam is reflected by a surface of the object, the reflected light passes through the receiving lens to be received by the avalanche photodiode, and the avalanche photodiode converts the optical signal into an electrical signal with a frequency being f1. The electrical signal with the frequency f2 that is coupled to the avalanche photodiode and the electrical signal with the frequency f1 are mixed on the avalanche photodiode to generate two electrical signals with new frequencies. The avalanche photodiode outputs the two electrical signals with new frequencies to the third amplifier circuit and band pass filter circuit to obtain a measurement signal. After the measurement signal is synchronized with the signal with the frequency f3 or an output signal of the frequency mixing filter circuit, a measured distance D1 is determined based on a phase of the synchronized measurement signal. The MCU controls the power supply of the green laser diode to be turned off and the power supply of the red laser diode to be turned on. At the same time, the MCU controls the analog switch to disconnect the amplified signal with the frequency f1 from the green laser diode and modulate the amplified signal with frequency f1 onto the red laser diode. A second laser beam irradiates an internal cavity of the rangefinder and is reflected and then received by the avalanche photodiode, thereby measuring a distance D2 by which the second laser beam is transmitted in the internal cavity of the rangefinder. A measured distance D is determined based on a difference between the measured distance D1 and the distance D2. Frequencies of the two electrical signals with new frequencies are f1+f2 and f1−f2, where f1>f2. A center frequency of a band pass filter circuit in the third amplifier circuit and band pass filter circuit is f1−f2.

Figure 4:
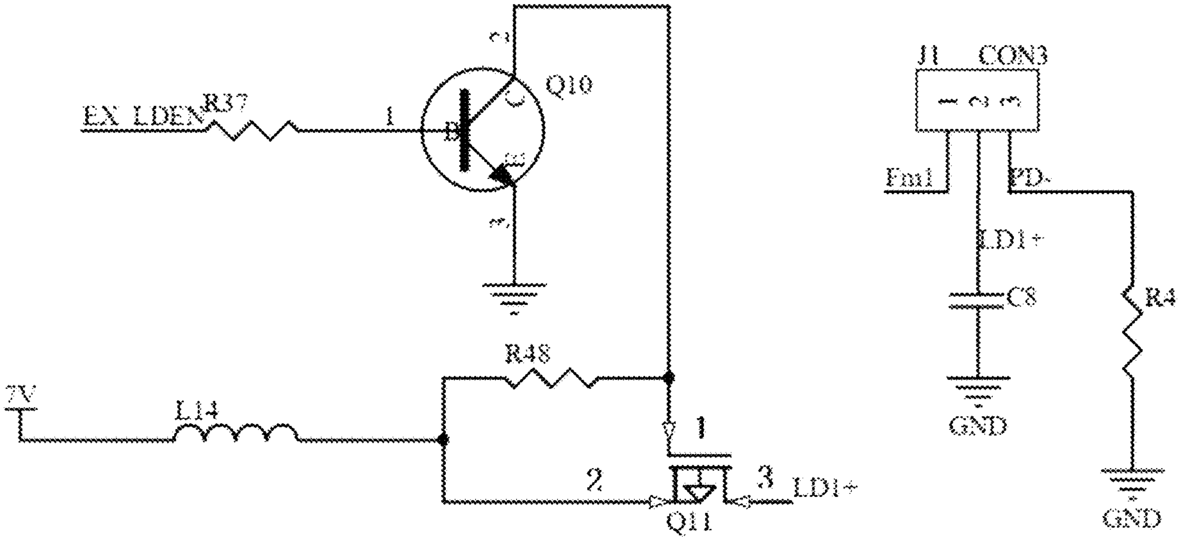
FIG. 4 is a schematic structural diagram of a second switch.

The first laser beam module includes a first power supply circuit, a first switch, and a green laser diode. A schematic structural diagram of the first switch is shown in FIG. 4.

Figure 3:
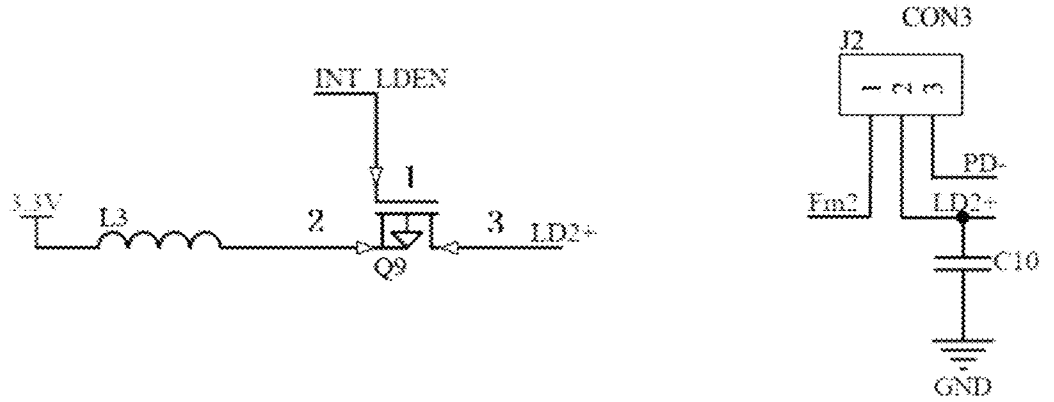
FIG. 3 is a schematic structural diagram of a first switch.

The second laser beam module includes a second power supply circuit, a second switch, and a red laser diode. A schematic structural diagram of the second switch is shown in FIG. 3.

A pin EX_LDEN of the MCU is connected to one end of R37, and the other end of R37 is connected to a pin 1 of Q10. A pin 3 of Q10 is grounded, and a pin 2 of Q10 is connected to a pin 1 of Q11. A 7 V power output is connected to one end of L14, and the other end of L14 is connected to R48 and then connected to a pin 2 of Q11. A pin 1 of a green laser diode J1 is connected to a pin 3 of U3. A pin 2 of J1 is connected to one end of C8, and the other end of C8 is grounded. A pin 3 of J1 is connected to one end of R4, and the other end of R4 is grounded.

A pin INT_LDEN of the MCU is connected to a pin 1 of Q9. An output of a 3.3 V power supply is connected to one end of L3, and the other end of L3 is connected to a pin 2 of Q9. A pin 3 of Q9 is connected to a pin 2 of the red laser diode J2, and a pin 1 of J2 is connected to a pin 1 of U3. The pin 2 of J2 is connected to one end of C10, and the other end of C10 is grounded. A pin 3 of J1 is connected to a pin 3 of J2.

A pin SW of the MCU is connected to a pin 5 of U3, and the output of the 3.3 V power supply is connected to one end of C28 and then connected to a pin 2 of U3. The other end of C28 is grounded. A pin 1 of Q1 is connected to one end of R8, and the other end of R8 is grounded. A pin 3 of Q1 is grounded, the 3.3 V power supply is connected to one end of R5, and the other end of R5 is connected to one end of C5 and then connected to a pin 2 of Q1 and a pin 1 of Q3. The other end of C5 is grounded. A pin 3 of Q3 is grounded, a pin 2 of Q3 is connected to one end of L7, and the other end of L7 is connected to a pin 1 of U3.

In a specific embodiment, after irradiating a tested object, a first laser beam is reflected by a surface of the tested object, and reflected light is received by the APD (D1) through a receiving lens. The APD (D1) converts an optical signal into an electrical signal with a frequency being f1. In addition, an electrical signal with the frequency f2 that is coupled to the APD (D1) and the electrical signal with the frequency f1 are mixed in the APD to generate two electrical signals with new frequencies: f1+f2 and f1−f2 (where f1>f2). The APD outputs the two signals to the third amplifier circuit and band pass filter circuit (a center frequency of a band pass filter circuit is f1−f2), leaving only the electrical signal with the frequency of f1−f2. The signal is a measurement signal. The MCU performs N frequency division on f3, so that f3/N=f1−f2. The MCU controls the ADC to sample the measurement signal at a jumping edge of a synchronization signal (f3/N), and Fourier calculation is performed on a sampled signal to obtain a phase value P1 of the measurement signal (the sum of a phase difference p1 generated by the transmission of a P1 laser beam 1 and a circuit and laser phase delay p1'). According to a theory of indirect difference frequency measurement, a distance represented by p1 is a distance by which the signal laser beam 1 travels. Similarly the MCU controls the power supply of the green laser diode (J1) to be turned off and the power supply of the red laser diode (J2) to be turned on. At the same time, the MCU controls the analog switch to disconnect a modulation signal f1 from the green laser diode (J1) and modulates the modulation signal f1 onto the red laser diode (J2). The laser beam 2 irradiates the internal cavity of the rangefinder and is reflected and then received by the APD (D1). Similarly, a phase P1' of the measurement signal (the sum of a phase difference p1" generated by the transmission of the P1' laser beam 2 and a circuit and laser phase delay p1") can be obtained.

It is assumed that f1=150 MHz, f2=150 M−5 kHz, f3=5 kHz, and a velocity of light C=3*$10^8$ m/s. A distance by which the laser beam 1 travels is d1 (d1≥20 cm), and a distance by which the laser beam 2 travels is d (d is less than or equal to 10 cm). A phase delay of a circuit and the laser diode 1 to f1 is p1", and a phase delay of a circuit and the laser diode 2 to f1 is p1'".

Let λ1=C/f1/2, and λ1 is a measuring ruler corresponding to a frequency of 150 MHz.

According to the above method, $$d1 = (p1/360) * \lambda 1 + (p1'/360) * 2 * \lambda 1.$$

$$d = (p1''/360) * 2 * \lambda 1 + (p1''/360) * 2 * \lambda 1.$$

In a double laser diode ranging system, d1 minus d is used to eliminate an influence of temperature on the ranging system, and a ranging result D=(d1−d)=(p1−2*p1")/360*λ1+(p1'−p1'")/360*2*λ1.

Let L=(p1−2*p1")/360*λ1, S=(p1'−p1'")/360*2*λ1, where L denotes a difference in propagation between the laser beam 1 and the laser beam 2, S denotes a difference in phase relay between a green laser diode related circuit and a red laser diode related circuit, and D=L+S.

When laser diodes are of the same model, p1" is equal to p1', and S=0. When laser diodes are of different models, p1" is not equal to p1', and S is not equal to 0.

When a single measuring ruler is used, a ranging result is limited by the measuring ruler. A higher frequency of the measuring ruler indicates higher accuracy, a shorter measuring ruler, and a limited ranging distance. A lower frequency of the measuring ruler indicates lower accuracy, a longer measuring ruler, and limited ranging accuracy. The usual practice is to select three or more measuring rulers and connect ranging results to meet requirements for ranging accuracy and a ranging distance of the rangefinder. With a rangefinder having a ranging distance of 100 meters as an example, the following three measuring rulers are selected.

Measuring ruler 1: $f1 = 150$ MHz, $f2 = 150\text{M} - 5$ kHz, $f3 = 5$ kHz, $\lambda 1 = 1$ m.

Measuring ruler 2: $f1' = 15$ MHz, $f2' = 15\text{M} - 5$ kHz, $f3' = 5$ kHz, $\lambda 2 = 10$ m.

-continued

Measuring ruler 3: $f1'' = 1.5$ MHz, $f2'' = 1.5\text{M} - 5$ kHz, $f3'' = 5$ kHz, $\lambda 3 = 100$ m.

Ranging results obtained by measuring the same distance by three measuring rulers are D1, D2, and D respectively. D1=L1+S1; D2=L2+S2; and D3=L3+S3.

When laser diodes are of the same model, S1=S2=S3=0; and D1, D2, and D3 have no problem in connection. When laser diodes are of different models, S1, S2, and S3 are not equal to 0 and are not equal to each other, which may lead to a connection error and an error of the ranging result D, as shown in the following embodiment.

The present disclosure further provides a measurement method for a green laser phase rangefinder, which is applied to the green laser phase rangefinder. The measurement method includes the following steps.

The green laser phase rangefinder is placed at a position away from a target surface by a standard measured distance of L0.

Based on the green laser phase rangefinder, a measuring ruler 1 is used for ranging to obtain a measured distance D1, a measured distance D2, and a measured distance D3, where the measured distance D1 corresponds to the measuring ruler 1; the measured distance D2 corresponds to the measuring ruler 2; the measured distance D3 corresponds to the measuring ruler 3; and a frequency of the measuring ruler 1 is greater than that of the measuring ruler 2 and that of the measuring ruler 3. D1=L1+S1; D2=L2+S2; and D3=L3+S3.

With the measured distance D1 as a reference distance, a deviation of the measuring ruler 2 relative to the measuring ruler 1 is determined as being $\nabla_{D2\text{-}D1}$=D2−D1 and a deviation of the measuring ruler 3 relative to the measuring ruler 1 is determined as being $\nabla_{D3\text{-}D1}$=D3−D1.

The measured distance D2 is corrected by means of $\nabla_{D2\text{-}D1}$ to obtain a measured distance D2'.

The measured distance D3 is corrected by means of the deviation $\nabla_{D3\text{-}D1}$ to obtain a measured distance D3'.

The measured distance D1, the measured distance D2', and the measured distance D3' are connected to obtain a measured distance D.

A measured distance C0 is obtained based on a difference between the standard measured distance L0 and the measured distance D.

Based on the green laser phase rangefinder, ranging is performed on a measured target by different measuring rulers to determine a connected measured distance D4.

A target measured distance is determined based on a difference between the connected measured distance D4 and the measured distance C0.

Embodiments of this description are described in a progressive manner, and each embodiment focuses on the difference from other embodiments. For the same and similar parts between the embodiments, reference may be made to each other. Since the system disclosed in an embodiment corresponds to the method disclosed in an embodiment, the description is relatively simple, and for related contents, reference may be made to the description of the method.

Specific examples are used herein for illustration of principles and implementations of the present disclosure. The descriptions of the above embodiments are merely used for assisting in understanding the method of the present disclosure and its core ideas. In addition, those of ordinary skill in the art can make changes in terms of specific implementations and the scope of application in accordance with the ideas of the present disclosure. In conclusion, the content of this description shall not be construed as limitations to the present disclosure.

What is claimed is:

1. A green laser phase rangefinder, comprising a direct digital synthesizer (DDS), a frequency mixing filter circuit, a microcontroller unit (MCU), a first amplifier circuit, an analog switch, a first laser beam module, a second laser beam module, a second amplifier circuit, an avalanche photodiode, a third amplifier circuit and band pass filter circuit, an analog-to-digital converter (ADC) module, a receiving lens, and a high-voltage circuit, wherein a green laser diode is arranged in the first laser beam module; and a red laser diode is arranged in the second laser beam module;

the DDS generates a signal with a frequency f1, a signal with a frequency f2, and a signal with a frequency f3; the signal with the frequency f1 passes through the first amplifier circuit and then enters the analog switch; the analog switch inputs an amplified signal with the frequency f1 into the first laser beam module and the second laser beam module; the signal with the frequency f2 passes through the second amplifier circuit and then is modulated on the avalanche photodiode; the signal with the frequency f1 and the signal with the frequency f2 are input into the MCU through the frequency mixing filter circuit; the signal with the frequency f3 is input to MCU to synchronize a measurement signal; and during ranging, the MCU controls a power supply of the green laser diode in the first laser beam module to be turned on, and a power supply of the red laser diode in the first laser beam module to be turned off; at the same time, the MCU controls the analog switch to modulate the amplified signal with the frequency f1 on the green laser diode and disconnect the amplified signal with the frequency f1 from the red laser diode, so that a first laser beam emitted by the green laser diode changes in brightness, with a change frequency the same as the frequency f1; after irradiating a tested object, the first laser beam is reflected by a surface of the object, the reflected light passes through the receiving lens to be received by the avalanche photodiode, and the avalanche photodiode converts the optical signal into an electrical signal with a frequency being f1; the electrical signal with the frequency f2 that is coupled to the avalanche photodiode and the electrical signal with the frequency f1 are mixed on the avalanche photodiode to generate two electrical signals with new frequencies; the avalanche photodiode outputs the two electrical signals with new frequencies to the third amplifier circuit and band pass filter circuit to obtain a measurement signal; after the measurement signal is synchronized with the signal with the frequency f3 or an output signal of the frequency mixing filter circuit, a measured distance D1 is determined based on a phase of the synchronized measurement signal; the MCU controls the power supply of the green laser diode to be turned off and the power supply of the red laser diode to be turned on; at the same time, the MCU controls the analog switch to disconnect the amplified signal with the frequency f1 from the green laser diode and modulate the amplified signal with frequency f1 onto the red laser diode; a second laser beam irradiates an internal cavity of the rangefinder and is reflected and then received by the avalanche photodiode, thereby measuring a distance D2 by which the second laser beam is transmitted in the internal cavity of the rangefinder; and a measured distance D is determined based on a difference between the measured distance D1 and the distance D2.

2. The green laser phase rangefinder according to claim 1, wherein the first laser beam module comprises a first power supply circuit, a first switch, and a green laser diode.

3. The green laser phase rangefinder according to claim 1, wherein the second laser beam module comprises a second power supply circuit, a second switch, and a red laser diode.

4. The green laser phase rangefinder according to claim 1, wherein frequencies of the two electrical signals with new frequencies are f1+f2 and f1−f2, wherein f1>f2.

5. The green laser phase rangefinder according to claim 4, wherein a center frequency of a band pass filter circuit in the third amplifier circuit and band pass filter circuit is f1−f2.

6. The green laser phase rangefinder according to claim 1, wherein the green laser diode has a band between 490 nm and 560 nm, and/or the red laser diode has a band between 580 nm and 905 nm.

7. A measurement method for a green laser phase rangefinder, applied to the green laser phase rangefinder according to claim 1, wherein the measurement method comprises:

placing the green laser phase rangefinder according to claim 1 at a position away from a target surface by a standard measured distance of L0;

using, based on the green laser phase rangefinder, a measuring ruler 1 for ranging to obtain a measured distance D1, a measured distance D2, and a measured distance D3, wherein the measured distance D1 corresponds to the measuring ruler 1; the measured distance D2 corresponds to a measuring ruler 2; the measured distance D3 corresponds to a measuring ruler 3; and a frequency of the measuring ruler 1 is greater than that of the measuring ruler 2 and that of the measuring ruler 3;

determining, with the measured distance D1 as a reference distance, a deviation $\nabla_{D2\text{-}D1}$ of the measuring ruler 2 relative to the measuring ruler 1 and a deviation $\nabla_{D3\text{-}D1}$ of the measuring ruler 3 relative to the measuring ruler 1;

correcting the measured distance D2 by means of $\nabla_{D2\text{-}D1}$ to obtain a measured distance D2';

correcting the measured distance D3 by means of the deviation $\nabla_{D3\text{-}D1}$ to obtain a measured distance D3';

connecting the measured distance D1, the measured distance D2', and the measured distance D3' to obtain a measured distance D;

obtaining a measured distance C0 based on a difference between the standard measured distance L0 and the measured distance D;

performing, based on the green laser phase rangefinder, ranging on a measured target by different measuring rulers to determine a connected measured distance D4; and determining a target measured distance based on a difference between the connected measured distance D4 and the measured distance C0.

* * * * *